United States Patent [19]
Aoki et al.

[11] Patent Number: 6,118,666
[45] Date of Patent: Sep. 12, 2000

[54] FLEXIBLE PRINTED WIRING BOARD AND CONNECTING STRUCTURE THEREOF

[75] Inventors: Nobuaki Aoki, Tokyo; Kazunori Takahashi, Saitama, both of Japan

[73] Assignee: Asahi Kogaku Kogyo Kabushiki Kaisha, Tokyo, Japan

[21] Appl. No.: 09/228,281

[22] Filed: Jan. 11, 1999

[30] Foreign Application Priority Data

Jan. 12, 1998 [JP] Japan .................................. 10-004298
Jan. 12, 1998 [JP] Japan .................................. 10-004299
Jan. 12, 1998 [JP] Japan .................................. 10-004300
Jan. 12, 1998 [JP] Japan .................................. 10-004301

[51] Int. Cl.$^7$ .............................. H05K 1/11; H01R 12/10
[52] U.S. Cl. ......................... 361/749; 361/777; 174/254; 174/261; 439/67; 396/542
[58] Field of Search .................................. 361/749, 777; 174/117 FF, 254, 261; 439/67, 77; 396/542; 324/754, 755, 757, 758

[56] References Cited

U.S. PATENT DOCUMENTS

| | | | |
|---|---|---|---|
| 3,979,763 | 9/1976 | Mills | 361/749 |
| 4,711,548 | 12/1987 | Arakawa et al. | 396/542 |
| 4,958,050 | 9/1990 | Oku et al. | 174/261 |

*Primary Examiner*—Jeffrey Gaffin
*Assistant Examiner*—John B. Vigushin
*Attorney, Agent, or Firm*—Greenblum & Bernstein, P.L.C.

[57] ABSTRACT

Disclosed is a flexible printed wiring board which includes: a first flexible board; a second flexible board which overlaps the first flexible board; a conductive wiring pattern formed on a portion of the first flexible board on which the second flexible board is laid; and at least one inspectional land, used for inspection of the conductive pattern, which is formed on the second flexible board. The second flexible board overlaps the first flexible board such that the conductive wiring pattern and the at least one inspectional land do not overlap each other in a direction parallel to a plane which is parallel to the first flexible board and the second flexible board when the second flexible board overlaps the first flexible board.

20 Claims, 12 Drawing Sheets

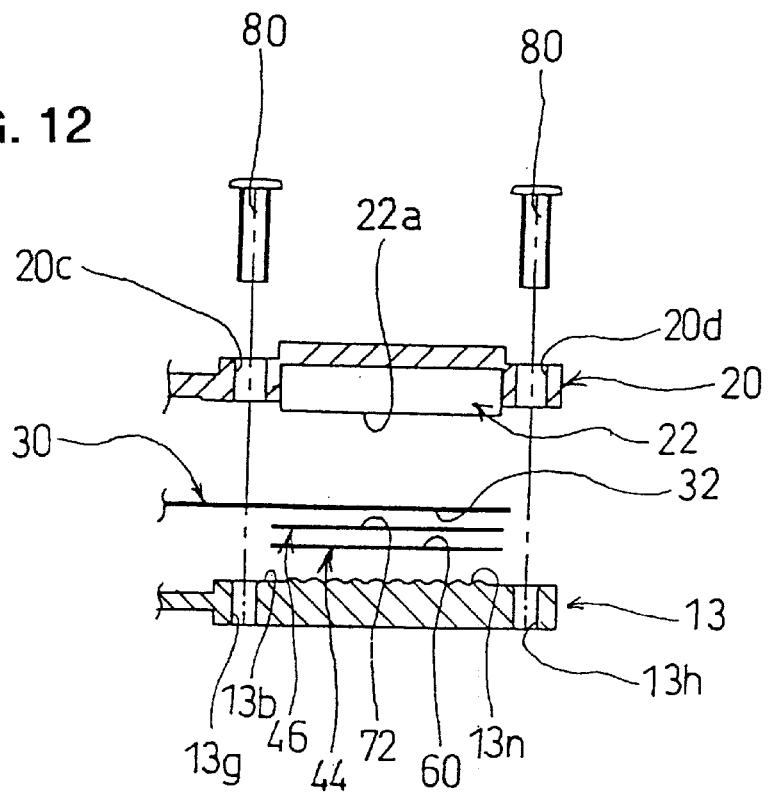
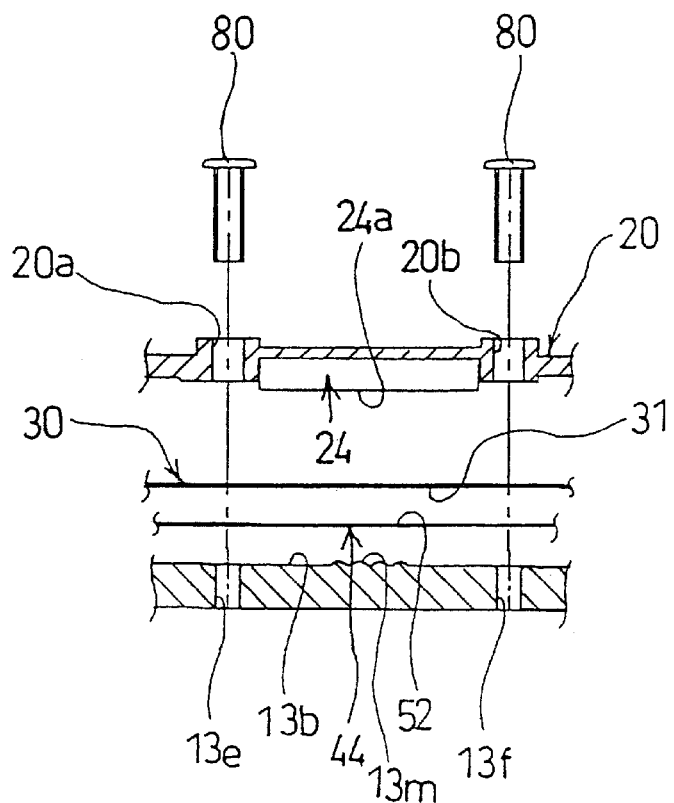

FLEXIBLE PRINTED WIRING BOARD AND CONNECTING STRUCTURE THEREOF

BACKGROUND OF THE INVENTION

1. Field of the Invention

The present invention relates to a flexible printed wiring board used for electrical apparatus and also relates a structure for electrically connecting two opposite lands formed on opposite surfaces of two flexible printed wiring boards.

2. Description of the Related Art

Flexible printed wiring boards are widely used for various types of electrical apparatuses such as cameras, watches, telephones, computers, automobile appliances to electrically connect, e.g., one or more electronic part or circuit with another.

It is often the case that two flexible printed wiring boards are arranged to overlap each other. In this arrangement, in the case where one or more inspectional land for the inspection of a conductive pattern using a probe is formed on either flexible printed wiring board, the probe can possibly penetrate the flexible printed wiring board at the inspectional land to thereby electrically contact the conductive pattern formed on the other flexible printed wiring board if the probe is pressed hard against the inspectional land, which makes it impossible to carry out proper inspection of the conductive pattern and/or even damaging the conductive pattern on the other flexible printed wiring board.

A flexible printed wiring board connecting structure is known in which two flexible printed wiring boards with one being laid over the other are held between two members (two pressing members) to press a land formed on a pressing surface of one of the two flexible printed wiring boards against a corresponding land formed on a pressing surface of the other flexible printed wiring board so as to electrically connect the lands. In this connecting structure, in the case where the width of each land array is large (e.g., the land is comprised of a great number of small lands), the width of the pressing surface of each pressing member also needs to be large, which makes it difficult to miniaturize an apparatus in which the flexible printed wiring boards are arranged. Furthermore, in such a connecting structure, in the case where each land is formed as an array of lands composed of a great number of lands and at the same time the two flexible printed wiring boards are held together with another flexible printed wiring board between the two pressing members, the arrays of lands of the two flexible printed wiring boards may not properly contact each other due to an uneven/rough surface of the two flexible printed wiring boards which is produced by the variation in thickness of the aforementioned another flexible printed wiring board due to the conductive pattern formed thereon.

SUMMARY OF THE INVENTION

An object of the present invention is to provide a flexible printed wiring board having a structure which effectively prevents the aforementioned problem that occurs when the probe penetrates the flexible printed wiring board at the inspectional land formed thereon.

Another object of the present invention is to provide a flexible printed wiring board having a structure which makes it possible to bring a land formed thereon into proper contact with a corresponding land formed on another flexible printed circuit board even if the width of the pressing surface of each of the two pressing members between which the two flexible printed wiring boards are held is small.

Yet another object of the present invention is to provide a flexible printed wiring board having a structure which makes it possible to bring the land into proper contact with a corresponding land formed on another flexible printed circuit board, even if the two flexible printed wiring boards with one being laid over the other are held between two pressing members to electrically connect the lands and if each land is made of a large number of lands; wherein the two flexible printed wiring boards are held together with another flexible printed wiring board between the two pressing members.

Other aspect and objects of the invention will become apparent to one skilled in the art from a reading of the following disclosure and the appended claims.

According to an aspect of the present invention, there is provided a flexible printed wiring board which includes: a first flexible board; a second flexible board which overlaps the first flexible board; a conductive wiring pattern formed on a portion of the first flexible board on which the second flexible board is laid; and at least one inspectional land, used for inspection of the conductive pattern, which is formed on the second flexible board, wherein the second flexible board overlaps the first flexible board such that the conductive wiring pattern and the at least one inspectional land do not overlap each other in a direction parallel to a plane which is parallel to the first flexible board and the second flexible board when the second flexible board overlaps the first flexible board.

Preferably, the size and shape of the second flexible board are substantially the same as the size and shape of at least part of the first flexible board on which the second flexible board overlaps.

Preferably, each of the first and second flexible boards includes a land which is to be brought into pressing contact with a corresponding land formed on another flexible printed wiring board.

Preferably, the second flexible board is laid on part of the first flexible board, wherein the land formed on the first flexible board is formed on the remaining part of the first flexible board on which the second flexible board is not laid.

According to another aspect of the present invention, there is provided with a flexible printed wiring board which includes: a bifurcated portion including a first flexible board and a second flexible board; a conductive wiring pattern formed on the first flexible board; and at least one inspectional land, used for inspection of the conductive wiring pattern, which is formed on the second flexible board, wherein at least a portion of the second flexible board on which the at least one inspectional land is formed is laid on top of the first flexible board upon at least part of the flexible printed wiring board being folded at least once, and wherein the conductive wiring pattern and the at least one inspectional land are formed on the first flexible board and the second flexible board, respectively, so as not to overlap each other in a direction parallel to a plane which is parallel to at least the portion of the second flexible board and the first flexible board when at least the portion of the second flexible board is laid on top of the first flexible board.

According to yet another aspect of the present invention, there is provided a flexible printed wiring board having a land with which a corresponding land formed on another flexible printed wiring board is brought into pressing contact. The flexible printed wiring board includes a first flexible board and a second flexible board which overlaps the first flexible board. The land of the flexible printed wiring board includes: a first land formed on a portion of the first flexible board on which the second flexible board does not overlap; and a second land formed on the second flexible board.

Preferably, the first and second lands are formed to oppose the another flexible printed wiring board upon the second flexible board overlapping the first flexible board.

Preferably, the first and second lands each include an array of lands arranged at predetermined intervals.

Preferably, the shape and size of the second flexible board are substantially the same as the shape and size of a portion of the first flexible board on which the second flexible board overlaps.

According to yet another aspect of the present invention, there is provided a flexible printed wiring board including: a plurality of flexible boards which overlap one another; and a land, formed on each of the plurality of flexible boards, which is brought into pressing contact with a corresponding land of another flexible printed wiring board.

Preferably, the plurality of lands are formed to oppose the another flexible printed wiring board with the plurality of flexible boards overlapping each other.

Preferably, the each land includes an array of lands arranged at predetermined intervals.

According to yet another aspect of the present invention, there is provided a flexible printed wiring board which includes: a first flexible board including an array of lands formed on one surface of the first flexible board, the array of lands being respectively brought into. pressing contact with a corresponding array of lands formed on another flexible printed wiring board; a second flexible board overlapping the other surface of the first flexible board; a plurality of conductive lines formed on the second flexible board to be positioned to correspond to the array of lands with the second flexible board overlapping the other surface of the first flexible board.

Preferably, the plurality of conductive lines include at least one dummy line.

Preferably, the first and second flexible boards each extend from a common flexible printed wiring board.

Preferably, the plurality of lines are formed at the same intervals as the array of lands.

According to yet another aspect of the present invention, there is provided a flexible printed wiring board connecting structure which includes: a first flexible printed wiring board having a first land formed on one surface of the first flexible printed wiring board; a second flexible printed wiring board having a second land formed on one surface of the second flexible printed wiring board, the first and second flexible printed wiring board overlapping each other with the first and second lands contacting each other; two pressing members between which the first and second flexible printed wiring boards are held with the first and second lands tightly contacting each other; and at least one projection formed on either one of the two pressing members for pressing the one of the first and second lands against the other of the first and second lands.

Preferably, the projection is in the shape of a hemisphere.

Preferably, the first land includes a first array of lands arranged at predetermined intervals, wherein the second land includes a second array of lands to correspond to the first array of lands to be overlapped thereon, and wherein the at least one projection includes an array of projections to correspond to the first and second arrays of lands, each projection of the array of projections projecting towards the other one of the two pressing members.

Preferably, each projection of the array of projections is in the shape of a hemisphere.

Preferably, the other of one of the two pressing members includes an elastic member.

Preferably, the elastic member is made of rubber.

The present disclosure relates to subject matter contained in Japanese Patent Applications Nos. 10-4298 (filed on Jan. 12, 1998), 10-4299 (filed on Jan. 12, 1998), 10-4300 (filed on Jan. 12, 1998) and 10 4301 (filed on Jan. 12, 1998), which are expressly incorporated herein by reference in their entireties.

BRIEF DESCRIPTION OF THE DRAWINGS

The present invention will be described below in detail with reference to the accompanying drawings in which:

FIG. 12 is an exploded cross-sectional view of part of the fundamental portion shown in FIG. 11 where the flexible printed wiring boards are held between two pressing members;

FIG. 13 is an exploded and cross-sectional view of another portion of the fundamental portion shown in FIG. 11 where flexible printed wiring boards are held between two pressing members;

DESCRIPTION OF THE PREFERRED EMBODIMENTS

Figure 1:
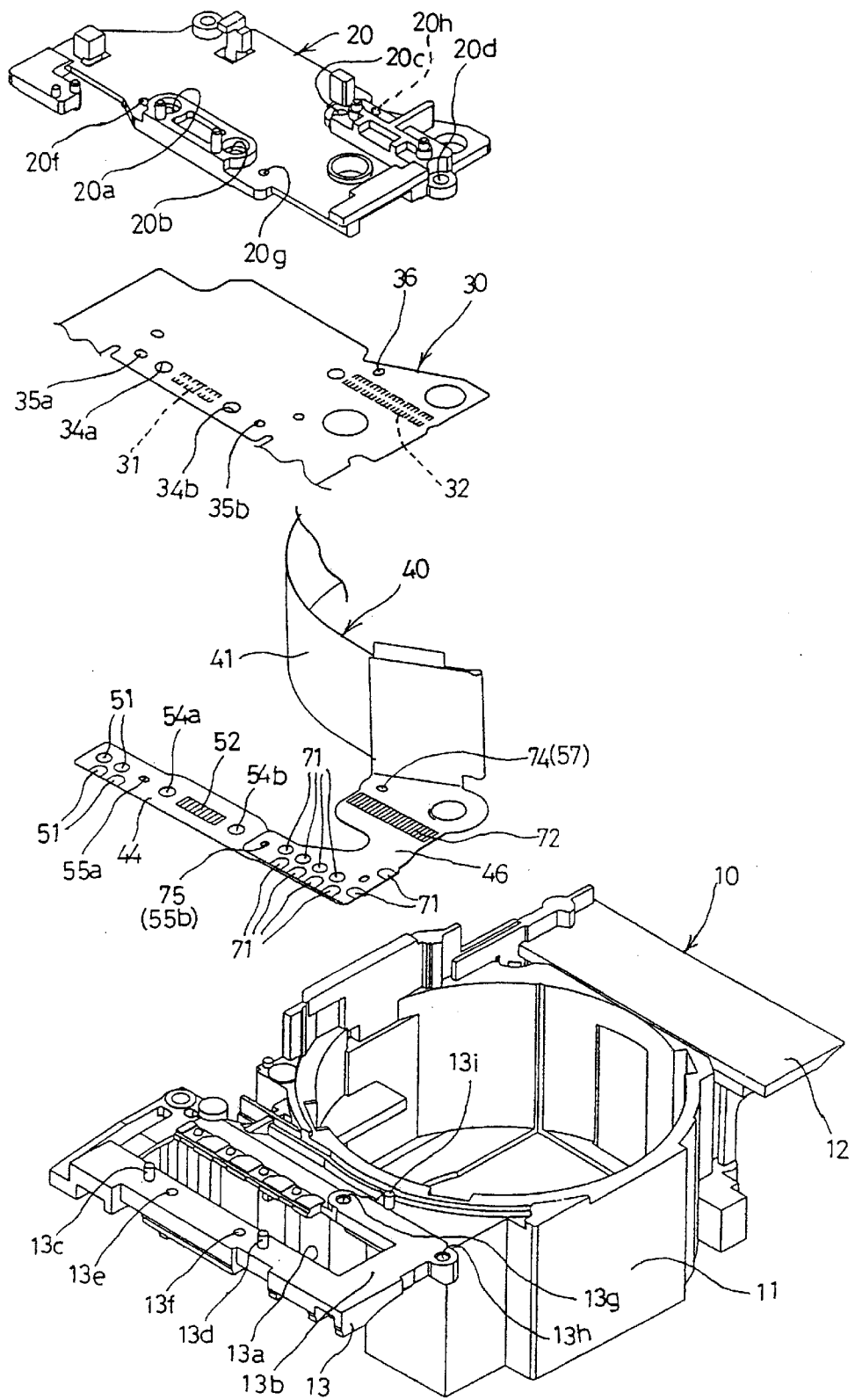
FIG. 1 is an exploded perspective view of a fundamental internal portion of a camera that includes flexible printed wiring boards to which an aspect of the present invention is applied.

FIG. 1 shows a fundamental internal portion of a compact camera that includes flexible printed wiring boards to which the present invention is applied. In this specification a flexible printed wiring board is hereinafter referred to as a flexible PWB.

In the illustrated embodiment (first embodiment) shown in FIG. 1, a flexible PWB 30 and a flexible PWB 40 are tightly held between two pressing members, i.e., a rectangular plate 13 and a holding plate 20, to electrically contact two arrays of lands 31 and 32 formed on the flexible PWB 30 with two corresponding arrays of lands 52 and 72 formed on the flexible PWB 40, respectively.

A frame 10 shown in FIG. 1 is a fixed internal element of the camera and is made of a synthetic resin. The frame 10 is provided at the center thereof with a stationary barrel 11 of a photographic Lens (not shown). The frame 10 is further provided, on one side and the opposite side of the stationary barrel 11, with a rectangular plate 12 and the aforementioned rectangular plate 13, respectively, which are formed integral with the stationary barrel 11. Each of the plates 12 and 13 extends substantially perpendicular to an axial direction of the stationary barrel 11. The aforementioned holding plate 20 is a member independent of the rectangular plate 13, and the flexible PWBs 30 and 40 are tightly held between the rectangular plate 13 and the holding plate 20.

The rectangular plate 13 is provided along a longitudinal direction thereof with a rectangular hole 13a. The rectangular plate 13 is further provided, on a front surface thereof around the rectangular hole 13a with an even pressing surface 13b having substantially the shape of a number "7". The flexible PWBs 30 and 40 are held between the pressing surface 13b and the inner surface of the holding plate 20 (the lower surface of the holding plate 20 as viewed in FIG. 1).

The rectangular plate 13 is provided on the pressing surface 13b thereof with two engaging pins 13c and 13d and two screw holes 13e and 13f in the vicinity of the two engaging pins 13c and 13d, respectively. The rectangular plate 13 is further provided on the pressing surface 13b thereof with two screw holes 13g and 13h on the opposite side over the rectangular hole 13a. The rectangular plate 13 is further provided on the pressing surface 13b thereof with an engaging pin 13i in the vicinity of the screw hole 13g. The holding plate 20 is provided with four through holes 20a, 20b, 20c and 20d to correspond to the screw holes 13e, 13f, 13g and 13h, respectively. The holding plate 20 is further provided with engaging holes 20f, 20g and 20h in which the engaging pins 13c, 13d and 13i are fitted, respectively.

Figure 6:
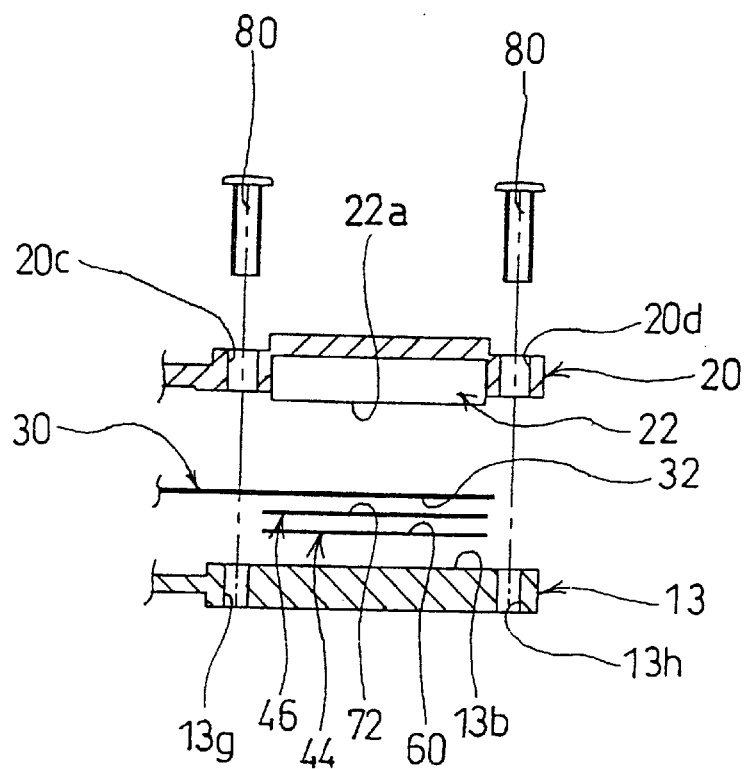
FIG. 6 is an exploded cross-sectional view of part of the fundamental portion shown in FIG. 1 where flexible printed wiring boards are held between two pressing members.

The holding plate 20 is provided, on the inner surface thereof between the through holes 20c and 20d, with a rubber plate 22 (see FIG. 6). The rubber plate 22 has a uniform thickness and is provided with an even pressing surface 22a. As can be seen in FIG. 6 the pressing surface 22a slightly projects towards the rectangular plate 13 from the inner surface of the holding plate 20, which faces the rectangular plate 13. Accordingly, the array of lands 32 on the flexible PWB 30 and the array of lands 72 on the flexible PWB 40 are tightly held with the elastic force of the rubber plate 22 between the pressing surface 22a of the rubber plate 22 and the pressing surface 13b of the rectangular plate 13.

Figure 7:
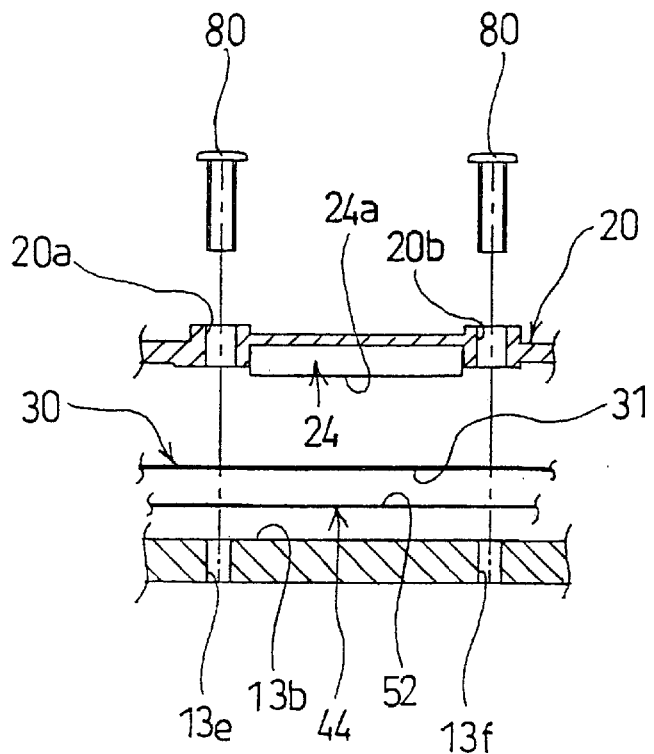
FIG. 7 is an exploded cross-sectional view of another part of the fundamental portion shown in FIG. 1 where flexible printed wiring boards are held between two pressing members.

The holding plate 20 is further provided, on a surface thereof between the through holes 20a and 20b, with a rubber plate 24 similar to the rubber plate 22 (see FIG. 7). The rubber plate 24 has a uniform thickness and is provided with an even pressing surface 24a. As can be seen in FIG. 7 the pressing surface 24a slightly projects towards the rectangular plate 13 from the inner surface of the holding plate 20, which faces the rectangularplate 13. Accordingly, the array of lands 31 on the flexible PWB 30 and the array of lands 52 on the flexible PWB 40 are tightly held with the elastic force of the rubber plate 24 between the pressing surface 24a of the rubber plate 24 and the pressing surface 13b of the rectangular plate 13.

Figure 2:
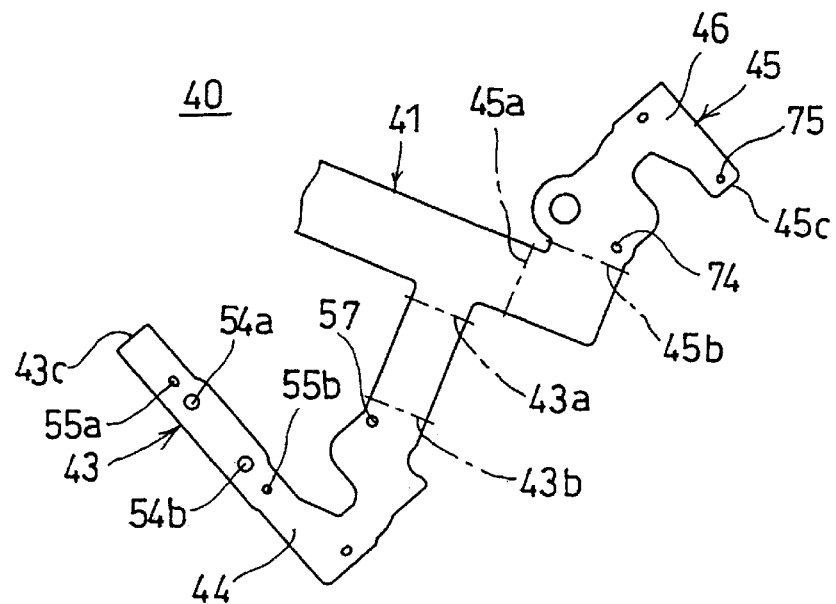
FIG. 2 is a developed view of part of a flexible printed wiring board shown in FIG. 1.

The flexible PWB 40 is of a type having the predetermined conductive pattern thereof on only one side (the side shown in FIG. 2) of the flexible PWB 40. The flexible PWB 40 is composed of an intermediate portion 41, a first branch portion 43 and a second branch portion 45. One end of the intermediate portion 41 bifurcates to form the first and second branch portions 43 and 45, and the other end of the intermediate portion 41 is connected to a specific circuit or the like (not shown) provided within the camera body. The first branch portion 43 has two fold lines, i.e., first and second fold lines 43a and 43b along which the flexible PWB 40 is to be folded when arranged in the camera body. The second branch portion 45 has two fold lines, i.e., third and fourth fold lines 45a and 45b along which the flexible PWB 40 is to be folded when arranged in the camera body. With the flexible PWB 40 initially laid out flat as viewed (for example) in FIG. 2, the flexible PWB 40 is folded over (by 180°) along the first fold line 43a wherein a portion of the first branch portion 43 can touch the surface of the intermediate portion. subsequently, with the first branch portion 43 face up, the first branch portion 43 of the flexible PWB 40 is folded up along the second fold line 43b (by 90°) wherein the folded portion (a first flat portion 44) projects upwards so as to be at a right angle to the remainder of the flexible PWB 40. Thereafter, the flexible PWB 40 is (for example) positioned wherein the first flat portion 44 lies along a horizontal plane and the remainder of the flexible PWB 40 lies vertically upward, at a right angle thereto, upon which the second branch portion (the second flat portion 46) is folded along the fourth fold line 45b (by 90°) so as to project along a horizontal plane in a direction opposite to the first flat portion 44. Thereafter, the flexible PWB 40 is folded along the third fold line 45a (by 180°) wherein the second flat portion 46 overlaps the first flat portion 44.

Figure 3:
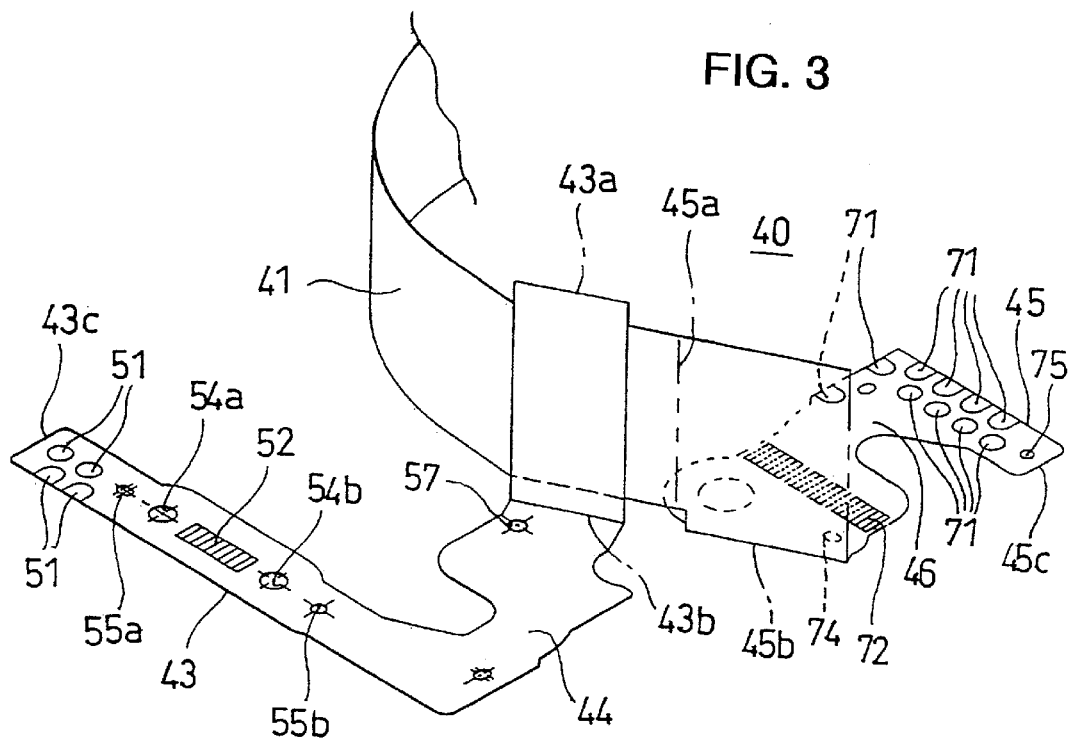
FIG. 3 is a perspective view of the flexible printed wiring board shown in FIG. 2 in a state before one folding portion of the flexible printed wiring board is folded.

Folding the flexible PWB 40 along the first through fourth fold lines 43a, 43b, 45a and 45b in the aforementioned predetermined manner allows the flexible PWB 40 to have the shape shown in FIG. 1. In FIG. 3 the flexible PWB 40 has been folded along the first, second and fourth fold lines 43a, 43b and 45b but has not been folded along the third fold line 45a.

As mentioned above, part of the flexible PWB 40 from the second fold line 43b to the tip 43c of the first branch portion 43 is referred to as a first flat portion (i.e., first flexible board) 44 which is laid over the pressing surface 13b of the rectangular plate 13; another part of the flexible PWB 40 from the fourth fold line 45b to the tip 45c of the second branch portion 45 is referred to as a second flat portion (i.e., second flexible board) 46 which is laid overlapping the first flat portion 44.

As can be seen from FIGS. 1 through 5, the shape and size of the second flat portion 46 are determined to be substantially the same as those of the specific portion of the first flat portion 44 on which the second flat portion 46 is positioned over. Therefore, when the second flat portion 46 is laid on the first flat portion 44 as shown in FIG. 1, the second flat portion 46 substantially fits over a corresponding portion of the first flat portion 44. Accordingly, the second flat portion 46 can be easily and precisely positioned visually with respect to the first flat portion 44 as shown in FIG. 1 when the second flat portion 46 is laid on the first flat portion 44.

Figure 4:
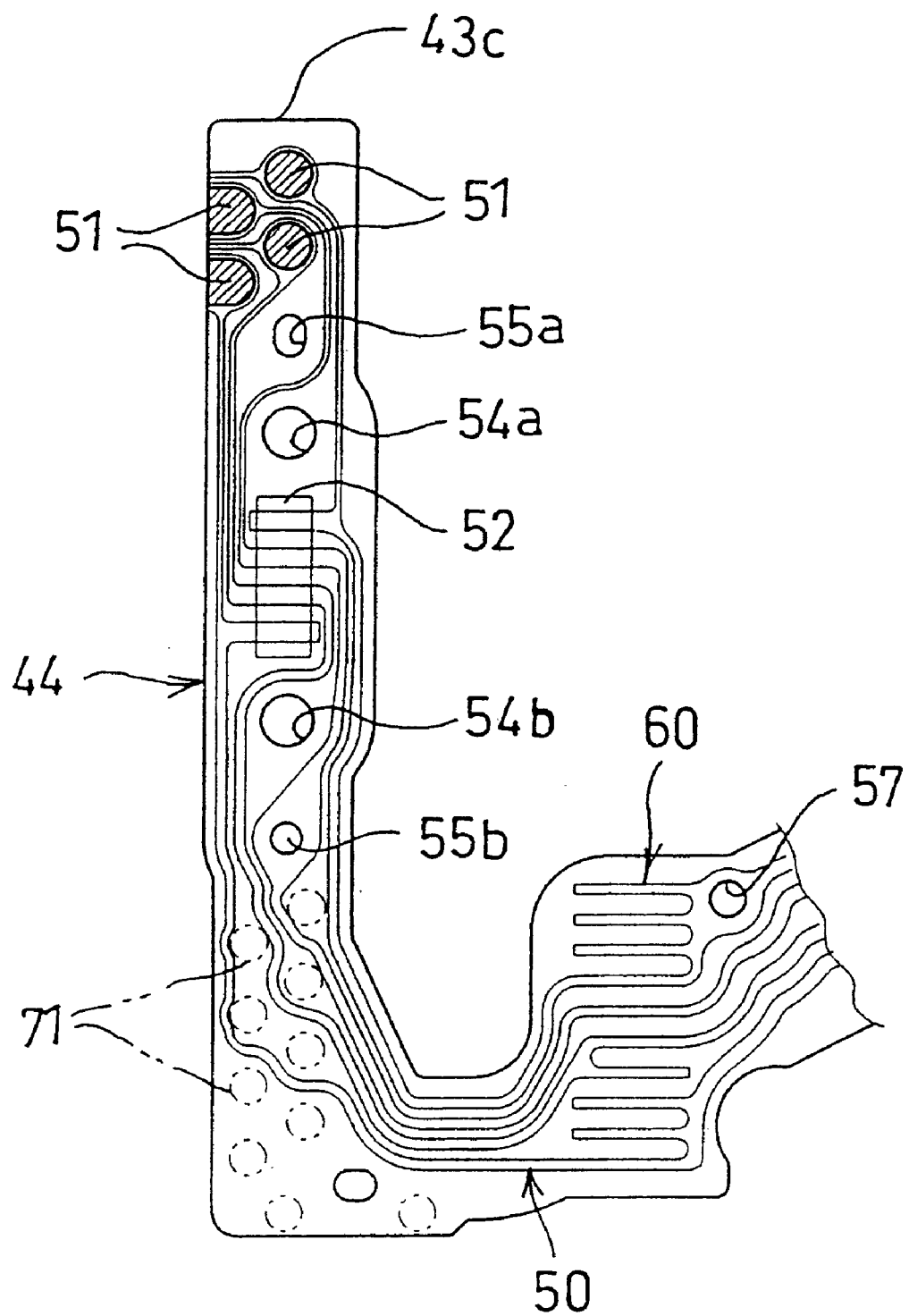
FIG. 4 is a plan view of part of the flexible printed wiring board shown in FIG. 3.

As shown in FIG. 4 the first flat portion 44 of the first branch portion 43 is provided on one side seen in FIG. 4 thereof with a predetermined conductive (wiring) pattern 50 composed of a plurality of lines extending from the intermediate portion 41. The conductive pattern 50 is made up of four independent lines insulated from each other. The terminal of each of the four lines is formed as an inspectional land 51 for pattern inspection in the vicinity of the tip 43c.

The first flat portion 44 is further provided in the vicinity of the inspectional lands 51 with an array of lands 52 which is brought into pressing contact with a corresponding array of lands 31 formed on the flexible PWB 30. The array of lands 52 is comprised of four lands which are formed by means of exposing part of each line of the conductive pattern 50. The array of lands 31 formed on the flexible PWB 30 is also composed of four lands which are respectively brought into pressing contact with the array of lands 52.

The first flat portion 44 is provided with two holes 54a and 54b between which the array of lands 52 is located. The holes 54a and 54b are formed to correspond to the two screw holes 13e and 13f. The first flat portion 44 is further provided with two holes 55a and 55b adjacent to the holes 54a and 54b, respectively. The holes 55a and 55b are formed to correspond to the engaging pins 13c and 13d formed on the rectangular plate 13. The corresponding portion of the flexible PWB 30 is laid directly on top of the portion of the first flat portion 44 (rather than the second flat portion 46) which extends from the tip 45c of the second flat portion 46 to the tip 43c of the first flat portion 44 with the second flat portion 46 laid overlapping the first flat portion 44.

Figure 8:
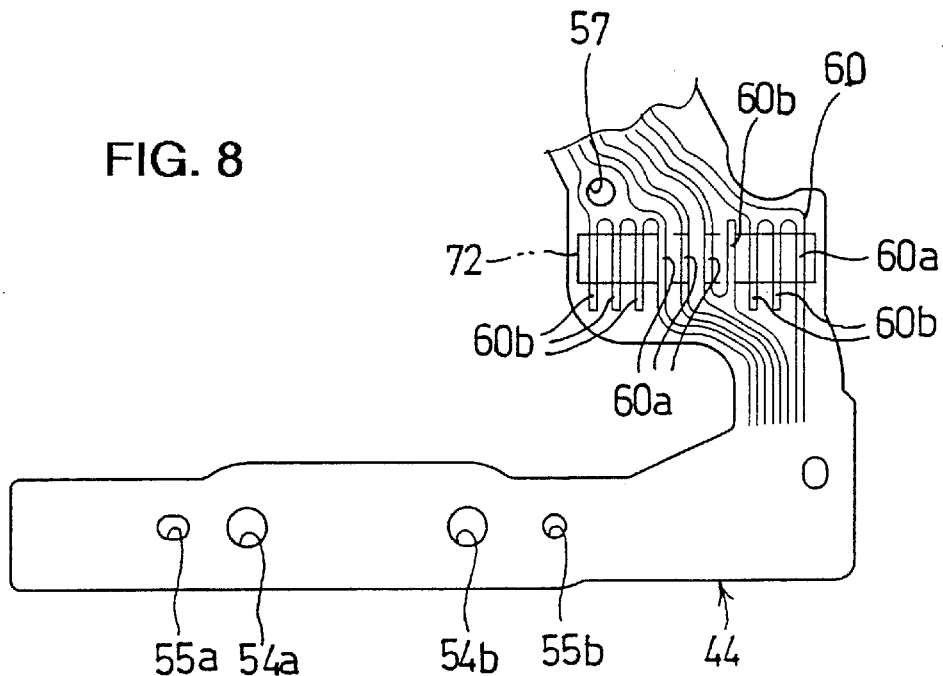
FIG. 8 is a plan view of part of the flexible printed wiring board shown in FIG. 3.
Figure 9:
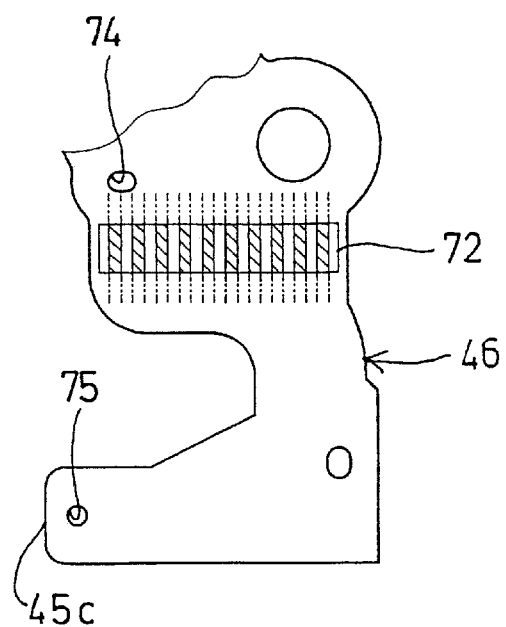
FIG. 9 is a plan view of another part of the flexible printed wiring board shown in FIG. 3.
Figure 10:
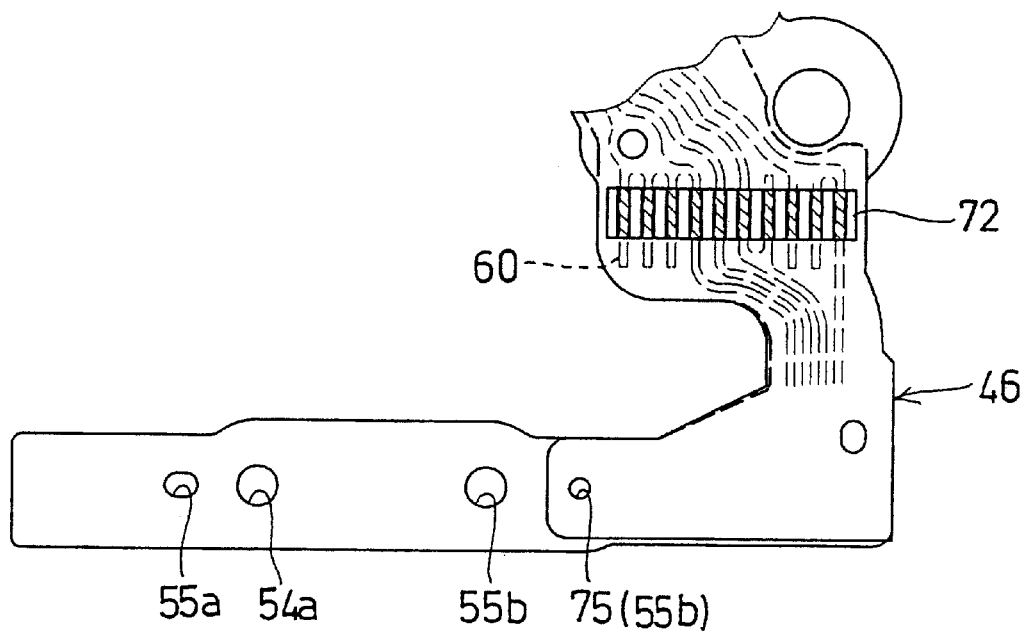
FIG. 10 is a plan view of the two parts of the flexible printed wiring board shown in FIG. 8 and 9 with the one portion overlapping the other portion.
Figure 11:
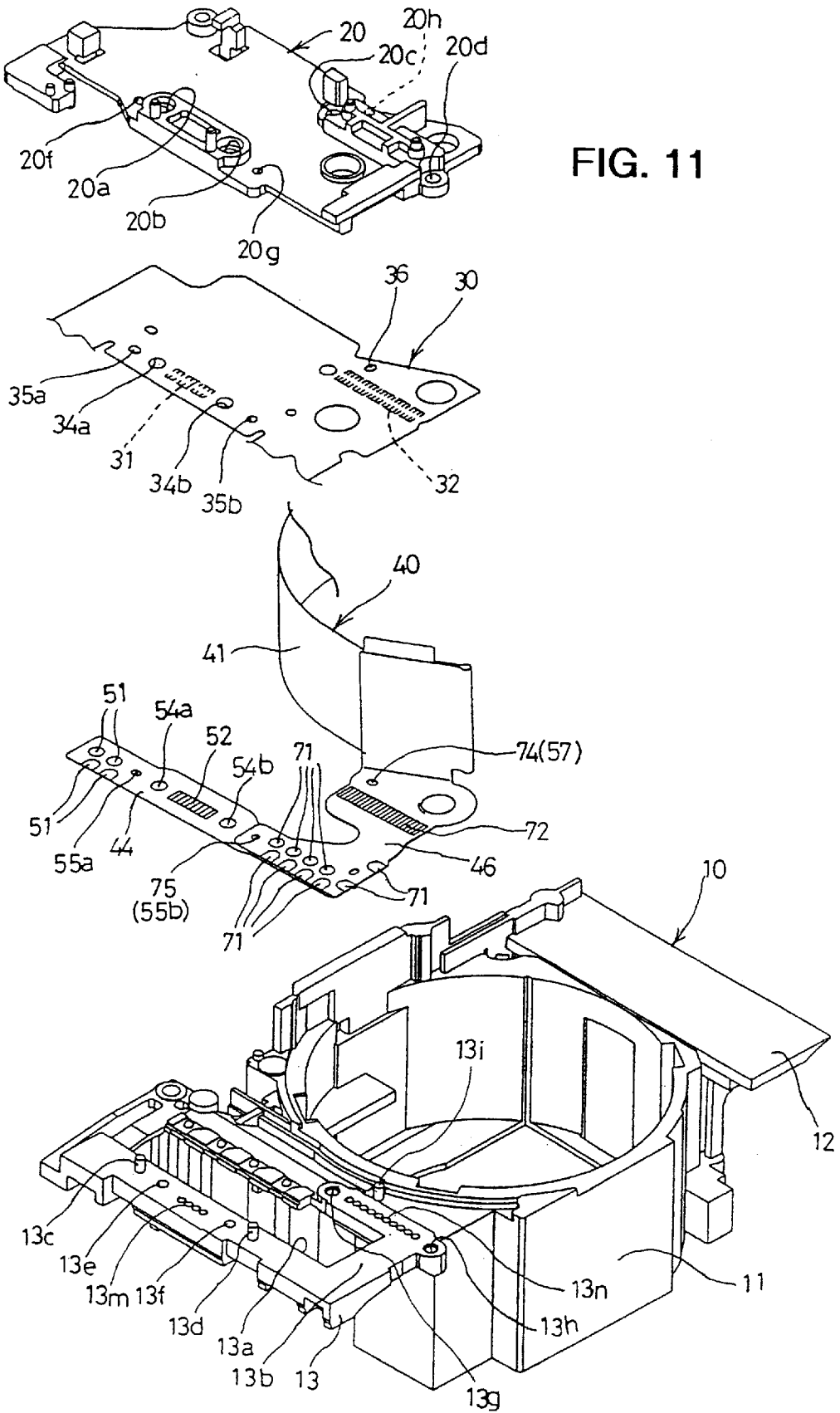
FIG. 11 is an exploded perspective view of a fundamental internal portion of a camera that includes flexible printed wiring boards to which another aspect of the present invention is applied.
Figure 14:
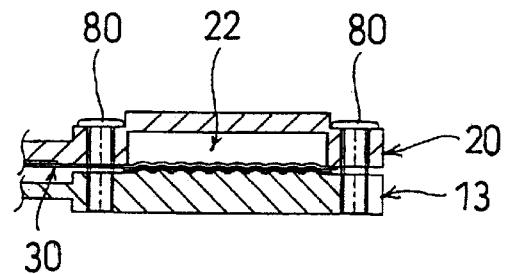
FIG. 14 is a cross-sectional view of the part of the fundamental portion shown in FIG. 12 in a state where the flexible printed wiring boards are tightly held between the two pressing members.
Figure 15:
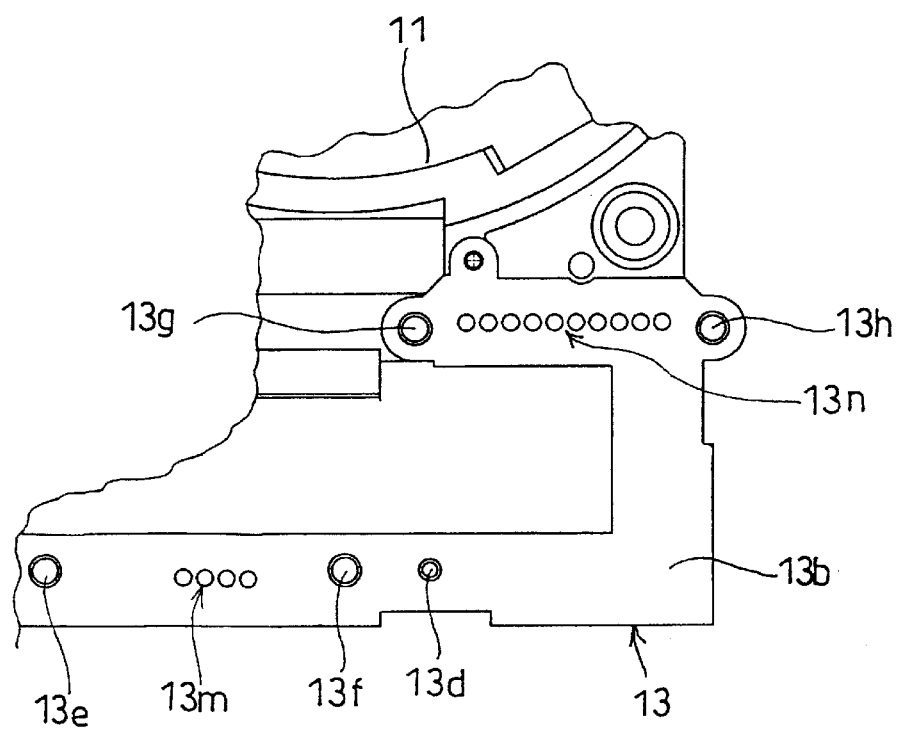
FIG. 15 is a plan view of part of one of the two pressing members shown in FIG. 11.

The first flat portion 44 is provided, on a specific portion thereof on which the second flat portion 46 is laid, with a conductive (wiring) pattern 60 consisting of ten parallel (conductive) lines 60a and 60b (see FIGS. 4 and 8). As can be understood from FIG. 8 only four lines 60a out of the ten lines are essential conductive lines for the conductive pattern. Namely, the remaining six lines 60b are made as 'dummy' lines. The ten lines of the conductive pattern 60 on the first flat portion 44 are formed to correspond to the ten lines (ten lands) of the array of lands 72, wherein the intervals of the ten lines of the conductive pattern 60 are determined to be identical to the intervals of the ten lands of the array of lands 72. Therefore, the positions of ten lines of the conductive pattern 60 are respectively coincident with the positions of ten lines of the array of lands 72 in a common plane when the second flat portion 46 is laid on the first flat portion 44 (see FIG. 10). This arrangement in which the conductive pattern 60 is formed by the four essential lines 60a and the six dummy lines 60b to correspond to the array of lands 72 effectively prevents the surface of the array of lands 72 from becoming uneven when the array of lands 32 and the array of lands 72 are tightly pressed against each other between the holding plate 20 and the rectangular plate 13 with the conductive pattern 60 being held between the array of lands 72 and the rectangular plate 13. This allows the array of lands 72 to firmly contact the array of lands 32. In FIG. 8 the position of the array of lands 72 with respect to the conductive pattern 60 is shown by two-dot chain line. In FIGS. 9 and 10 each land of the array of lands 72 is shown by oblique lines.

Figure 5:
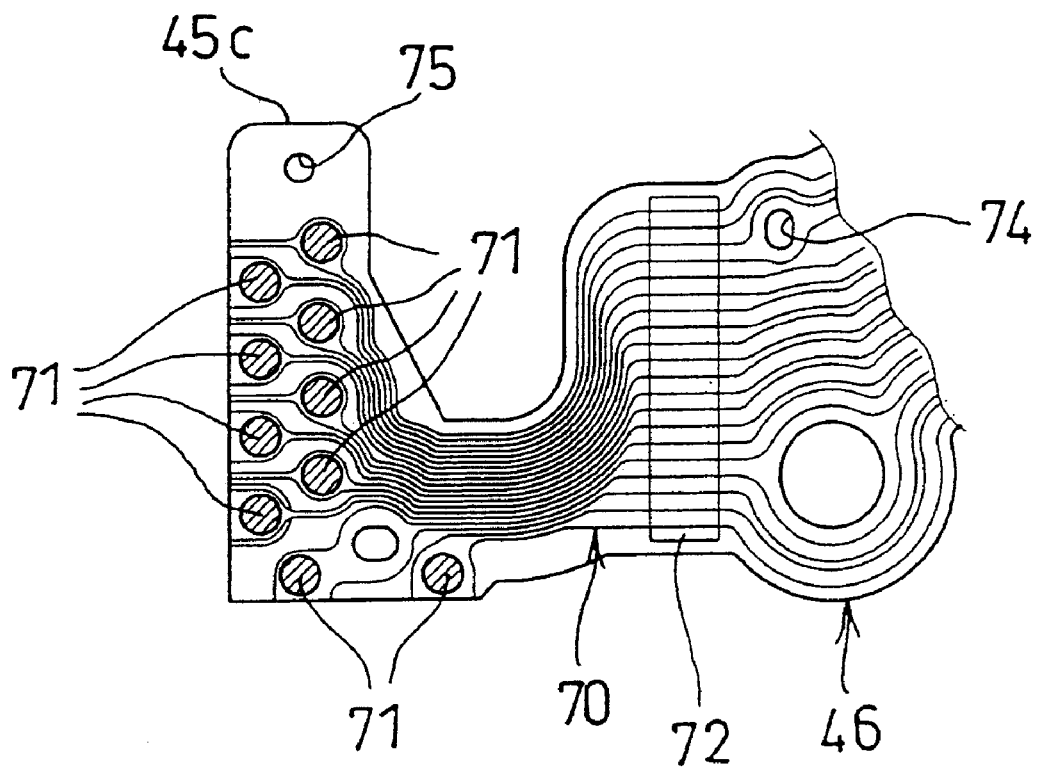
FIG. 5 is a plan view of another portion of the flexible printed wiring board shown in FIG. 3.

As shown in FIG. 5, the second flat portion 46 of the second branch portion 45 is provided on one side thereof with a predetermined conductive (wiring) pattern 70 which is composed of a plurality of lines extending from the intermediate portion 41. The conductive pattern 70 is made up of ten independent lines insulated from each other. The terminal of each of the ten lines is formed as a circular inspectional land 71 for pattern inspection.

The second flat portion 46 is further provided with an array of lands 72 which is brought into pressing contact with a corresponding array of lands 32 formed on the flexible PWB 30. The array of lands 72 is composed of ten lands which are formed by exposing part of each line of the conductive pattern 70. The array of lands 32 formed on the flexible PWB 30 is also composed of ten lands which are respectively brought into pressing contact with the ten lands of the array of lands 72.

The second flat portion 46 is provided in the vicinity of the array of lands 72 with an engaging hole 74. The engaging hole 74 is coincident with an engaging hole 57 (see FIG. 4) formed on the first flat portion 44 when the second flat portion 46 is laid on the first flat portion 44. The second flat portion 46 is further provided in the vicinity of the tip 45c thereof with an engaging hole 75 which is engaged with the engaging pin 13d of the rectangular plate 13.

As shown in FIG. 1 the flexible PWB 30 is provided with holes 34a, 34b, 35a, 35b and 36 which are coincident with the holes 54a, 54b, 55a, 75 (55b) and 74 (57), respectively, when the flexible PWB 30 is laid on the flexible PWB 40 which is in a state shown in FIG. 1.

The conductive pattern 50 and the inspectional lands 71 are formed on the first flat portion 44 and the second flat portion 46, respectively, so as not to overlap (coincide with) each other in a direction parallel to a common plane which is parallel to the first flat portion 44 and the second flat portion 46: i.e., in a direction parallel to the page of FIG. 4, when the second flat portion 46 is laid on the first flat portion 44. In other words, the conductive pattern 50 and the inspectional lands 71 are formed on the first flat portion 44 and the second flat portion 46, respectively, so as to lie at different positions in a common plane including the first flat portion 44 and the second flat portion 46 when the second flat portion 46 is laid on top of the first flat portion 44. In FIG. 4 the positions of the inspectional lands 71 with respect to the first flat portion 44 are each shown by a circular two-dot chain line when the second flat portion 46 is laid on the first flat portion 44. It can be understood from FIG. 4 that the conductive pattern 50 and the inspectional lands 71 lie at different positions in a common plane. This arrangement prevents any inspectional lands 71 from being electrically connected to the conductive pattern 50 on the first flat portion 44 even if a probe for pattern inspection penetrates the second flat portion 46 at any inspectional land 71 to thereby contact the first flat portion 44.

The way of holding the flexible PWBs 30 and 40 between the rectangular plate 13 and the holding plate 20 will be hereinafter discussed. First of all, the flexible PWB 40 is folded in the aforementioned manner along the first through fourth fold lines 43a, 43b, 45a and 45b to have the shape shown in FIG. 1. Subsequently, the flexible PWB 40 is placed on the pressing surface 13b of the rectangular plate 13 while the engaging pins 13c, 13d and 13i are fitted in the hole 55a, 55b (and 75), 57 (and 74), respectively. Thereafter, the flexible PWB 30 is placed on the flexible PWB 40 while the engaging pins 13c, 13d and 13i are fitted in the holes 35a, 35b and 36, respectively.

After the flexible PWB 40 and 30 have been laid on the pressing surface 13b in order according to the aforementioned manner, the holding plate 20 is placed on the flexible PWB 30 while the engaging pins 13c, 13d and 13i are fitted in the holes 20f, 20g and 20h, respectively. Thereafter a set screw 80 (see FIGS. 6 and 7) is inserted into each of the screw holes 20a, 20b, 20c and 20d to be screwed in the corresponding screwhole 13e, 13f, 13g or 13h. Consequently, the flexible PWBs 30 and 40 are held between the rectangular plate 13 and the holding plate 20 while the arrays of lands 52 and 72 are pressed against the arrays of lands 31 and 32 by the elastic force of the rubber plates 24 and 22, respectively.

FIGS. 11 through 17 show another embodiment (second embodiment) of the present invention. In this second embodiment a first array of projections 13m and a second array of projections 13n are formed to correspond to the array of lands 52 and the array of lands 72 on the pressing surface 13b of the rectangular plate 13, respectively. The first and second embodiments are the same except for the first and second arrays of projections 13m and 13n provided in the second embodiment, the arrays of lands 52 and 72 on the flexible PWB 40 are in contact more securely with the corresponding arrays of lands 31 and 32 on the flexible PWB 30, respectively.

The first array of projections 13m consists of four hemispherical projections aligned longitudinally with respect to the array of lands 52. The four projections are formed to correspond to the four lands of the array of lands 52. Therefore, when the flexible PWBs 30 and 40 are held between the holding member 20 and the rectangular plate 13, each land of the array of lands 52 is raised towards the corresponding land of the array of lands 31 by a corresponding projection of the array of projections 13m, which makes a sure electrical contact between the array of lands 31 and the array of lands 52.

Figures 16, 17:
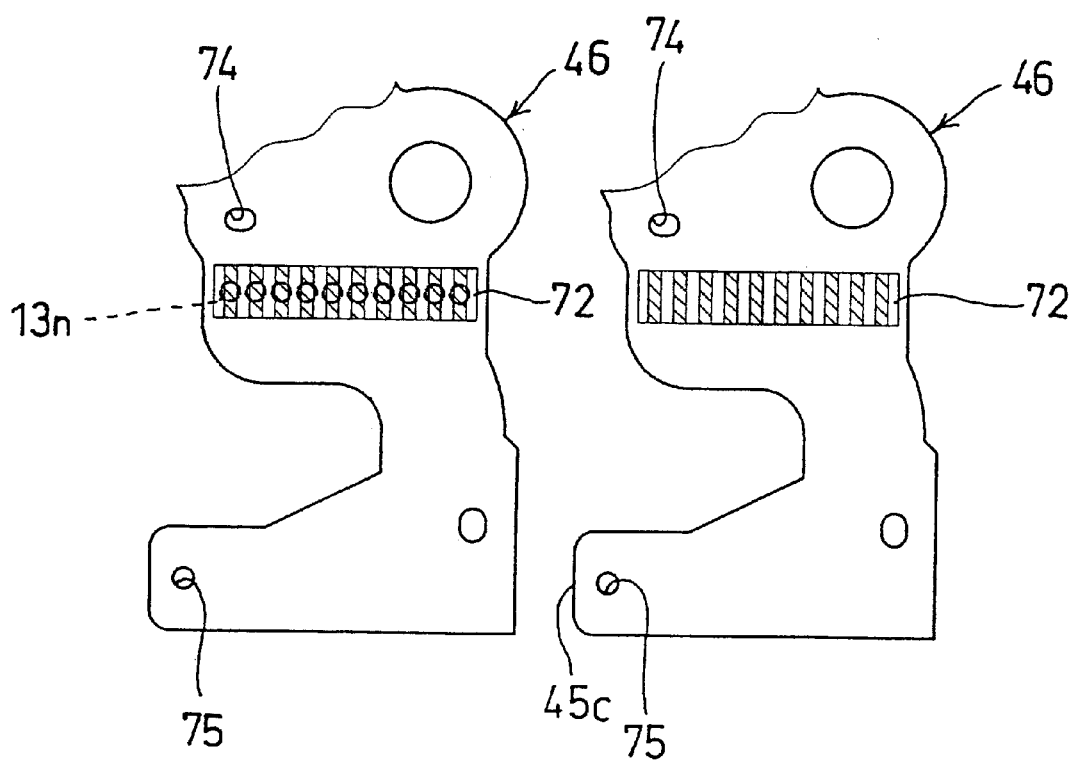
FIG. 16 is a plan view of a second flat portion of a flexible printed wiring board shown in FIG. 11.
FIG. 17 is an explanatory view showing a state where an array of lands formed on the second flat portion shown in FIG. 16 are respectively laid over an array of projections formed on the pressing member shown in FIG. 15.

The second array of projections 13n consists of ten hemispherical projections aligned longitudinally with respect to the array of lands 72. The ten projections are formed to correspond to the ten lands of the array of lands 72. Therefore, when the flexible PWBs 30 and 40 are held between the holding member 20 and the rectangular plate 13, each land of the array of lands 72 is raised towards the corresponding land of the array of lands 32 by a corresponding projection of the array of projections 13n, which makes a sure electrical contact between the array of lands 32 and the array of lands 72 (see FIG. 14). In FIGS. 16 and 17 each land of the array of lands 72 is shown by oblique lines; in FIG. 17 the positions of the array of projections 13n with respect to the array of lands 72 are shown by dotted circle.

In the second embodiment, the arrays of lands 31 and 52 firmly and securely contact each other via the rubber plate 24 and the first array of projections 13m. Likewise, the arrays of lands 32 and 72 firmly and securely contact each other via the rubber plate 22 and the second array of projections 13n.

Figure 18:
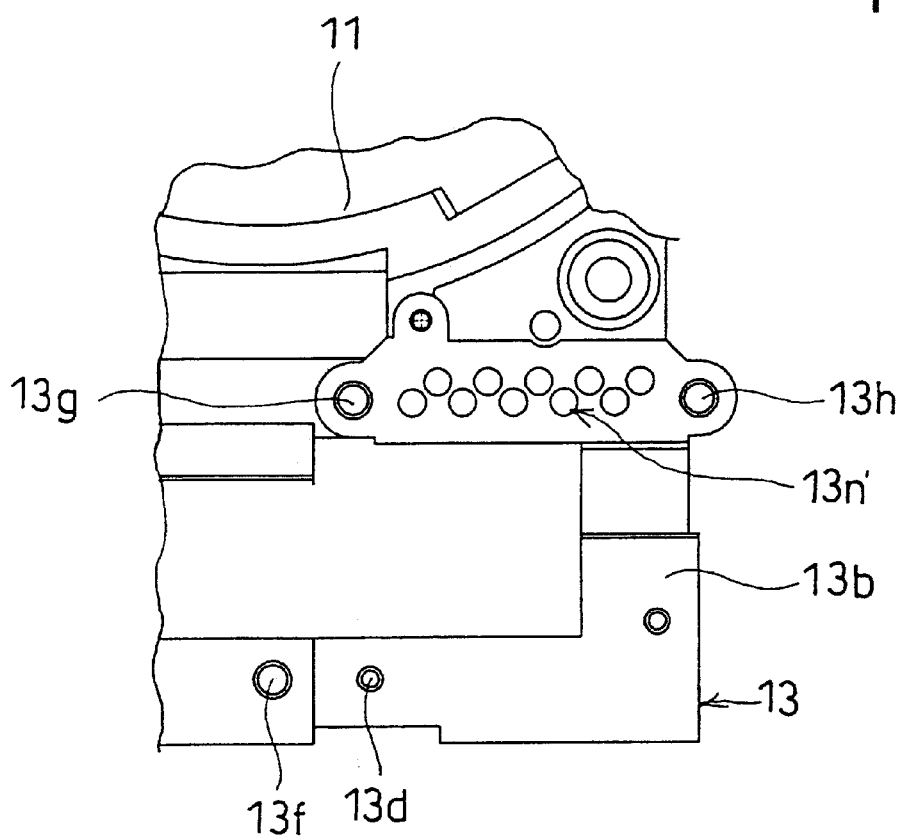
FIG. 18 is a plan view of another embodiment of an array of projections formed on the pressing member shown in FIG. 15.
Figure 19:
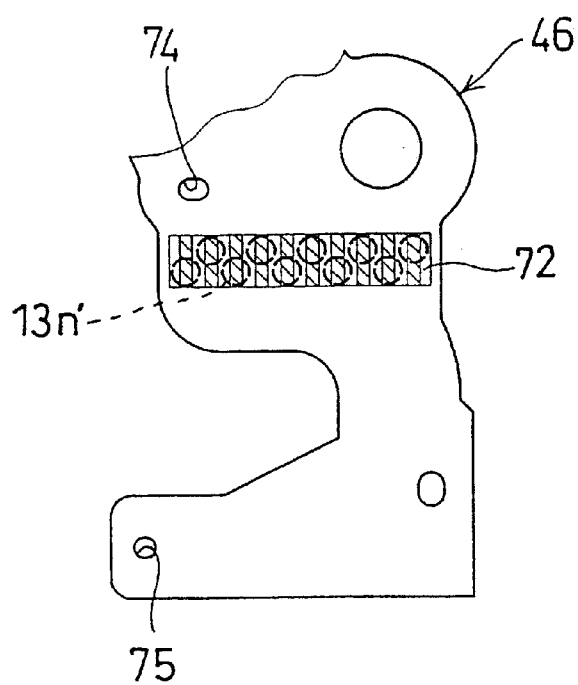
FIG. 19 is an explanatory view showing a state where the array of lands formed on the second flat portion shown in FIG. 16 are respectively laid over the array of projections shown in FIG. 18.

FIGS. 18 and 19 show another embodiment of an array of projections formed on the pressing surface 13b of the rectangular plate 13. In this embodiment an array of projections 13n' are formed on the pressing surface 13b, instead of the second array of lands 13n shown in FIG. 15. The array of projections 13n' consists of ten hemispherical projections which correspond to the ten lands of the array of lands 72. The ten projections are arranged in a zigzag path on the pressing surface 13b along the array of lands 72. With such a zigzag arrangement of the array of projections 13n', each land of the array of lands 72 can be securely brought into contact with the corresponding land of the array of lands 32 even if the intervals of the lands of the array of lands 72 are narrow. With the array of projections 13n', a result similar to that obtained in the case of the array of projections 13n can be obtained. in the embodiment having the arrays of projections 13m and 13n (or 13n'), the number of projections of the array of projections 13m is four while the number of projections of the array of projections 13n (or 13n') is ten. However, the number of projections of the array of projections 13m, 13n or 13n' can be any other number, as long as the number of projections correspond to the number of the corresponding array of lands.

In the embodiment having the arrays of projections 13m and 13n (or 13n'), these projections are formed on the pressing surface 13b while the rubber plates 22 and 24 are secured to the holding plate 20, but the projections can be formed on the holding plate 20 while the rubber plates 22 and 24 can be secured to the pressing surface 13b.

In each embodiment the pressing surface 13b is narrow, wherein a pressed area on the flexible PWBs 30 and 40 between the rubber plates 22 and 24 is correspondingly narrow and small. If the flexible printed wiring board 40 is not provided with the first branch portion 43 or the second branch portion 46, but instead with only a single narrow branch portion which is to be laid on and along the narrow pressing surface 13b of the rectangular plate 13, it would be impossible to form fourteen lines which substitute the four lines of the first flat portion 44 and the ten lines of the second flat portion 46 on one surface (the surface which faces the flexible PWB 30) of the narrow branch portion. Consequently, the arrays of lands corresponding to the arrays of lands 52 and 72 cannot be formed on the narrow branch portion.

However, according to the embodiments, the intermediate portion 41 bifurcates to form the first branch portion 43 and the second branch portion 45 and the second branch portion 45 is laid overlapping the first branch portion 43. This structure realizes that the two arrays of lands 52 and 72 are positioned on and along the narrow pressing surface 13b of the rectangular plate 13.

In each embodiment the intermediate portion 41 bifurcates to form two branch portions, i.e., the first branch portion 43 and the second branch portion 45. However, more than two branch portions extending from the intermediate portion 41 can be formed. In this case a land or an array of lands are formed on each branch portion and at least two branch portions overlap each other. In this arrangement, at the stage where at least two branch portions are overlapping each other, the land or the array of lands are positioned at different positions on the same side of the flexible PWB 40 which faces the flexible PWB 30, so as to tightly contact the corresponding land or array of lands formed on the flexible PWB 30.

In each embodiment, the number of the independent lines of the conductive pattern 50 is four while the number of inspectional lands 71 is ten. However, there can be any number of independent lines or inspectional lands 71.

In each embodiment, the flexible PWBS to which the present invention is applied are provided in a compact camera; however, the flexible PWBs can be provided in any other electrical apparatus such as: various other kinds of cameras, watches, telephones, computers, automobile appliances to electrically connect, e.g., two or more electronic parts or circuits.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A flexible printed wiring board comprising:
    a first flexible board having a plurality of conductive lines;
    a second flexible board having an array of lands, a surface of said array of lands contacting an array of lands provided on another flexible printed wiring board;
    the plurality of conductive lines provided on the first flexible board positioned to overlap another surface of said array of lands provided on the second flexible board, when the first flexible board overlaps the second flexible board.

2. The flexible printed wiring board according to claim 1, wherein said first and second flexible boards each extend from a common flexible printed wiring board.

3. The flexible printed wiring board according to claim 1, wherein said plurality of conductive lines are formed at the same intervals as said array of lands.

4. A flexible printed wiring board comprising:
    a first flexible board having a plurality of conductive lines;
    a second flexible board having an array of lands, a surface of said array of lands contacting an array of lands provided on another flexible printed wiring board;
    the plurality of conductive lines provided on the first flexible board positioned to overlap another surface of said array of lands provided on the second flexible board, when the first flexible board overlaps the second flexible board,
    wherein said plurality of conductive lines include at least one dummy line.

5. The flexible printed wiring board according to claim 4, wherein said plurality of conductive lines are formed at the same intervals as said array of lands.

6. A flexible printed wiring board comprising:
    a first flexible board;
    a second flexible board which overlaps said first flexible board;
    a conductive wiring pattern formed on a portion of said first flexible board on which said second flexible board is laid; and
    at least one inspectional land, used for inspection of said conductive pattern, which is formed on said second flexible board,
    wherein said second flexible board overlaps said first flexible board such that said conductive wiring pattern and said at least one inspectional land do not overlap each other in a direction parallel to a plane which is parallel to said first flexible board and said second flexible board when said second flexible board overlaps said first flexible board.

7. The flexible printed wiring board according to claim 6, wherein the size and shape of said second flexible board are substantially the same as the size and shape of at least part of said first flexible board on which said second flexible board overlaps.

8. The flexible printed wiring board according to claim 6, wherein each of said first and second flexible boards comprises a land which is to be brought into pressing contact with a corresponding land formed on another flexible printed wiring board.

9. The flexible printed wiring board according to claim 8, wherein said second flexible board is laid on part of the first flexible board, and wherein said land formed on the first flexible board is formed on the remaining part of the first flexible board on which said second flexible board is not laid.

10. A flexible printed wiring board comprising:
    a bifurcated portion comprising a first flexible board and a second flexible board;
    a conductive wiring pattern formed on said first flexible board; and
    at least one inspectional land, used for inspection of said conductive wiring pattern, which is formed on said second flexible board,
    wherein at least a portion of said second flexible board on which said at least one inspectional land is formed is laid on top of said first flexible board upon at least part of said flexible printed wiring board being folded at least once, and
    wherein said conductive wiring pattern and said at least one inspectional land are formed on said first flexible board and said second flexible board, respectively, so as not to overlap each other in a direction parallel to a plane which is parallel to at least said portion of said second flexible board and said first flexible board when at least said portion of said second lexible board is laid on top of said first flexible board.

11. A flexible printed wiring board having a land with which a corresponding land formed on another flexible printed wiring board is brought into pressing contact, said flexible printed wiring board having a bifurcated portion at one end, said flexible printed wiring board comprising:
    a first flexible board which comprises one leg of the bifurcated portion; and
    a second flexible board which comprises another leg of the bifurcated portion and overlaps said first flexible board;
    said land of said flexible printed wiring board comprising:
        a first land provided on a portion of said first flexible board on which said second flexible board does not overlap; and
        a second land provided on said second flexible board on which said first flexible board overlaps.

12. The flexible printed wiring board according to claim 11, wherein said first and second lands are formed to oppose said another flexible printed wiring board upon said second flexible board overlapping said first flexible board.

13. The flexible printed wiring board according to claim 11, wherein said first and second lands each comprise an array of lands arranged at predetermined intervals.

14. The flexible printed wiring board according to claim 11, wherein the shape and size of said second flexible board are substantially the same as the shape and size of a portion of said first flexible board on which said second flexible board overlaps.

15. A flexible printed wiring board connecting structure comprising:
    a first flexible printed wiring board having a first land formed on one surface of said first flexible printed wiring board;

a second flexible printed wiring board having a second land formed on one surface of said second flexible printed wiring board, said first and second flexible printed wiring boards overlapping each other with said first and second lands contacting each other;

two pressing members between which said first and second flexible printed wiring boards are held with said first and second lands tightly contacting each other; and at least one projection formed on either one of said two pressing members for pressing said one of said first and second lands against the other of said first and second lands.

16. The flexible printed wiring board connecting structure according to claim 15, wherein said projection is in the shape of a hemisphere.

17. The flexible printed wiring board connecting structure according to claim 15, wherein said first land comprises a first array of lands arranged at predetermined intervals, and wherein said second land comprises a second array of lands to correspond to said first array of lands to be overlapped thereon, and wherein said at least one projection comprises an array of projections to correspond to said first and second arrays of lands, each projection of said array of projections projecting towards the other one of said two pressing members.

18. The flexible printed wiring board connecting structure according to claim 17, wherein each projection of said array of projections is in the shape of a hemisphere.

19. The flexible printed wiring board connecting structure according to claim 15, wherein the other one of said two pressing members comprises an elastic member.

20. The flexible printed wiring board connecting structure according to claim 19, wherein said elastic. member is made of rubber.

* * * * *